US006349226B1

United States Patent
Yoshino et al.

(10) Patent No.: US 6,349,226 B1
(45) Date of Patent: Feb. 19, 2002

(54) OXIDE SUPER CONDUCTIVE WIRE AND A SUPER CONDUCTIVE DEVICE

(75) Inventors: Hisashi Yoshino, Tokyo; Mutsuki Yamazaki, Kanagawa-ken, both of (JP)

(73) Assignee: Kabuhsiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/499,743

(22) Filed: Feb. 8, 2000

(30) Foreign Application Priority Data

Feb. 26, 1999 (JP) .......................................... 11-050930

(51) Int. Cl.$^7$ .......................... H01B 12/02; H01L 39/12
(52) U.S. Cl. ...................... 505/230; 505/236; 505/237; 174/125.1
(58) Field of Search ................................ 505/230, 232, 505/236, 237, 430, 434; 174/125.1

(56) References Cited

U.S. PATENT DOCUMENTS

| | | | |
|---|---|---|---|
| 5,017,553 A | * 5/1991 | Whitlow et al. ................ 505/1 |
| 5,168,127 A | * 12/1992 | Kohno et al. ............ 174/125.1 |
| 5,739,086 A | 4/1998 | Goyal et al. |
| 5,741,377 A | * 4/1998 | Goyal et al. ................. 148/512 |
| 5,874,384 A | * 2/1999 | Balachandran et al. ...... 505/230 |
| 6,226,858 B1 | * 5/2001 | Matsumoto et al. .......... 29/599 |
| 6,246,007 B1 | * 6/2001 | Tanaka et al. ........... 174/125.1 |

FOREIGN PATENT DOCUMENTS

JP          2877367        1/1999

OTHER PUBLICATIONS

J. D. Budai, et al., "In–Plane Epitaxial Alignment of $YBa_2Cu_3O_{7-x}$ Films Grown on Silver Crystals and Buffer Layers", Appl. Phys. Lett., vol. 62, No. 15, Apr. 12, 1993, pp. 1836–1838.

* cited by examiner

Primary Examiner—Mark Kopec
(74) Attorney, Agent, or Firm—Oblon, Spivak, McClelland, Maier & Neustadt, P.C.

(57) ABSTRACT

An oxide superconductive wire having practically sufficient tensile strength and superconductive properties is claimed. A first aspect of the present invention includes a first metallic layer made of a silver based alloy containing a metal selected from the group consisting of copper, antimony, tin, germanium, gallium, indium, zinc, platinum and palladium; a second metallic layer having a tensile strength higher than that of silver and fixed to the first metallic layer; and an oxide superconductor layer formed on the first metallic layer. Another aspect of the present invention provides an oxide superconductive wire having first and a second layers and an oxide superconductive wire. The first metallic layer is made of silver and oriented along crystallographic (210) plane. The second metallic layer has a tensile strength higher than that of silver and is fixed to the first metallic layer. The present invention also provides a superconductive device using each of the oxide superconductive wires. The oxide superconductor layer formed on the first metallic layer of the superconductive device is disposed on the inner side of a coiled oxide superconductive wire.

16 Claims, 1 Drawing Sheet

OXIDE SUPER CONDUCTIVE WIRE AND A SUPER CONDUCTIVE DEVICE

The present Application claims priority of Japanese Patent Application Ser. No. 11-50930 filed on Feb. 26, 1999.

BACKGROUND OF THE INVENTION

1. Field of the Invention

The present invention relates to an oxide superconductive wire and a superconductive device using an oxide superconductor.

2. Discussion of the Background

Oxide superconductors based on systems such as Y—Ba—Cu—O, Bi—Sr—Ca—Cu—O, or Tl—Ba—Ca—Cu—O yield high critical temperatures not lower than the boiling point of liquid nitrogen, and are hence of high industrial value because they allow the use of an inexpensive liquid nitrogen as the cooling medium instead of the expensive liquid helium or can be easily cooled to the superconductive state by using a compact freezer.

Such oxide superconductors should be first processed into wires to ease their use in the practical application field of energy. As the effective means for processing them into wire materials, there are known methods of fabricating tape-like superconductive wires by forming superconductive films on a metallic tape by, for instance, a coating method, a vapor phase growth method, or a liquid phase growth method.

For example, there is known a wire material using Hastelloy alloy having excellent heat resistance or silver, which undergoes little reaction with an oxide superconductive wire as a metallic tape. In case of using the materials above, a variety of attempts have been made to obtain oxide superconductors with highly oriented crystals because this is essential to realize high critical current density.

In the case of using Hastelloy, a method comprising fabricating a buffer layer using yttrium-stabilized zirconia (YSZ), MgO, etc., by a particular method has been studied in order to grow a superconductive film having a high crystallographic orientation and yet free from-reaction with the oxide superconductor during the formation of the film. This method realizes a critical current at a practically sufficient high density. However, this is not always the most suitable method for fabricating long wire materials because it requires a complicated production process.

The method using silver as the metallic tape, on the other hand, is expected to be promising for obtaining long wire materials by a simple process because silver is less reactive with an oxide superconductor and because a film of the oxide superconductor can be directly deposited thereon. Recently, as disclosed in, for example, Japanese Patent No. 2813287, critical current is available at a practically high density level by using a tape comprising a collective texture of superconductors formed on the (100) and (110) planes of thermally treated silver. According to the disclosure, there is also described a metallic tape using a complex alloy of the elements which hardly forms a solid solution with silver; i.e., iron, nickel, or chromium, as the core material, and silver is formed thereon. By using the metallic tape having the constitution above, a tensile strength higher than that comprising silver alone can be obtained. Such a metallic tape can be handled more easily, and, moreover, it may provide a critical current at a higher effective density because the thickness thereof can be reduced.

SUMMARY OF THE INVENTION

In case of using the complex alloys above as the metallic tapes for forming thereon thin films of oxide superconductors, the present inventors recently found that the adhesion strength between the silver layer and the core material is not always sufficiently high in case the tape is processed into a thinner tape and subjected to the film deposition process, and problems of peeling off are found to occur on the silver layer.

In the light of the aforementioned circumstances, a first aspect of present invention provides an oxide superconductive wire comprising a first metallic layer, a second metallic layer, and an oxide superconductor layer. The first metallic layer is made of silver based alloy consisting essentially of silver and a metal selected from the group consisting of copper, antimony, tin, germanium, gallium, indium, zinc, platinum and palladium. The second metallic layer is fixed on the first metallic layer and has a tensile strength higher than that of silver. The oxide superconductor layer is formed on said first metallic layer.

In the first aspect of the present invention, the second metallic layer may consist essentially of nickel, iron, or chromium.

In the first aspect of the present invention, the second metallic layer may be made of nickel based alloy, and the nickel based alloy may consist essentially of nickel and an element selected from the group consisting of aluminum, copper, chromium, manganese, silicon, antimony, and zinc.

In the first aspect of the present invention, the second metallic layer may be made of silver based alloy.

In the first aspect of the present invention, the first metallic layer may cover the second metallic layer.

In the first aspect of the present invention, the first metallic layer may be oriented along the crystallographic (110), (100), or (210) plane.

In the light of the aforementioned circumstances, a second aspect of the present invention provides an oxide superconductive wire comprising a first metallic layer, a second metallic layer, and an oxide superconductor layer. The first metallic layer is made of silver based alloy consisting essentially of silver and a metal selected from the group consisting of copper, antimony, tin, germanium, gallium, indium, zinc, platinum and palladium. The second metallic layer is made of sintered alloy consisting essentially of silver powder and powder of nickel, iron, chromium, or nickel based alloy. The nickel-based alloy consists essentially of nickel and an element selected from the group consisting of aluminum, copper, chromium, manganese, silicon, antimony, and zinc. The second metallic layer has a tensile strength higher than that of silver, and is fixed on the first metallic layer. The oxide superconductor layer is formed on the first metallic layer.

In the second aspect of the present invention, the first metallic layer may be oriented along the crystallographic (110), (100), or (210) plane.

In the second aspect of the present invention, the first metallic layer may cover the second metallic layer.

In the light of the aforementioned circumstances, a third aspect of the present invention provides an oxide superconductive wire comprising a first metallic layer, a second metallic layer, and an oxide superconductor layer. The first metallic layer consists essentially of silver and oriented along crystallographic (210) plane. The second metallic layer has a tensile strength higher than that of silver and is fixed to the first metallic layer. The oxide superconductor layer formed on the first metallic layer.

In the third aspect of the present invention, the first metallic layer may cover the second metallic layer.

In the third aspect of the present invention, the second metallic layer may be made of silver based alloy.

Each of oxide superconductive wires of the first, second, and third aspects of the present invention might be provided in a superconductive device. In the superconductive device, the oxide superconductive wire may be coiled so that the oxide superconductor layer is disposed on the inner side of the coiled wire and the oxide superconductive wire may be covered with an insulator layer.

The tensile strength of the second metallic layer of each of the aspects may be found about by measuring the tensile strength of replica of the material of the second metallic layer. Well-known analysis apparatus may measure the material of the second metallic layer from information of the cross sectional surface of the second metallic layer.

The silver based alloy of each of the first and the second aspects of the present invention contains silver of more than 50 atomic % of its whole body.

Above mentioned crystallographic plane orientation of the first metallic layer of the each aspect of the present invention, the (110), (100), or (210) plane is oriented such that each plane may be parallel to the first metallic layer.

The foregoing and other objects, features, and advantages of the invention will be apparent from the following more particular description of a preferred embodiment of the invention as illustrated in accompanying drawings.

DESCRIPTION OF THE PREFERRED EMBODIMENTS

Embodiments for practicing the present invention are described in further detail below. It should be understood, however, that the present invention is not only limited thereto.

EXAMPLE 1

Figure 1:
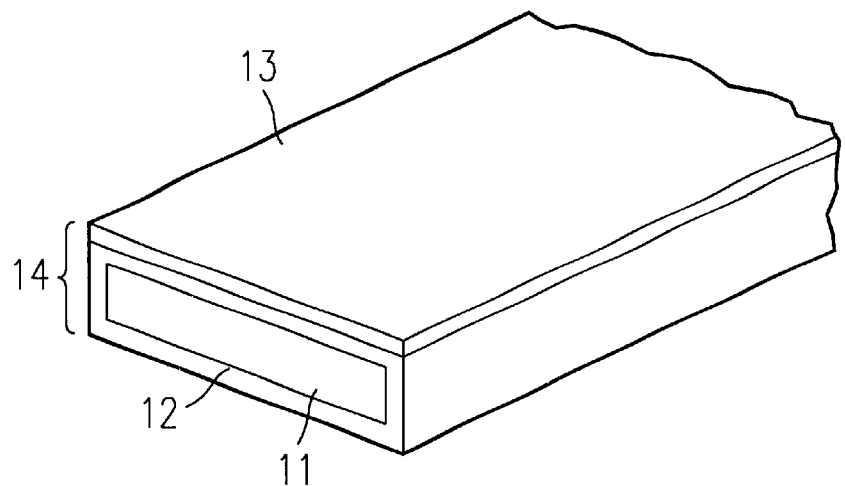
FIG. 1 shows a bird's-eye view showing a constitution of the oxide superconductive wire including a cross-section according to an embodiment of the present invention.

A first embodiment according to the present invention is described below. FIG. 1 shows the constitution of the first embodiment.

Referring to FIG. 1, the oxide superconductive wire according to the present embodiment comprises a second metal 11 as a high strength metal and a silver alloy as a first metal 12 covering the second metal 11, and an oxide superconductor film 13 tightly adhered to the first metal 12.

The method for production is described in detail below. An alloy containing about 99.9 atomic % of Ag and about 0.1 atomic % of Cu is produced as the silver based alloy by a common melting method, and is processed into a tube about 4 mm in inner diameter and about 6 mm in outer diameter. A nickel rod about 4 mm in outer diameter is used as the high strength metal and is inserted into the resulting tube, and both ends of the resulting tube are vacuum sealed to obtain an airtight structure. The specimen thus obtained is subjected to repeated rolling at room temperature to obtain two types of tape-like specimens both having a surface oriented in (110) crystallographic plane. Thus, one had a sheet thickness of about 0.1 mm and the other had a sheet thickness of about 0.05 mm. The metallic tapes 14 thus obtained are held at a temperature of about 650° C., and as an oxide superconductor film 13, an $YBa_2Cu_3O_{7-\delta}$ film is formed at a thickness of about 500 nm by means of laser ablation. The oxygen defect is expressed by $\delta$, and in general, it is a numeral not more than 1.

On performing measurements on the metallic tapes 14 of the oxide superconductive wire thus obtained by the method above, they are found to contain nickel portions each about 0.08 mm and about 0.04 mm in thickness, both favorably adhered to the silver alloy layer. The tensile strength after processing is found to be about 50 kg/mm$^2$, and is the same for both specimens. The silver alloy is investigated by means of X-ray diffraction, and is found to have a (110) crystallographic orientation. The specimens obtained by forming an oxide superconductor film 13 on the metallic tape 14 had no peeling off of the silver alloy layer, and are found to have a favorable c-axis crystallographic orientation. On obtaining the pole figure, four-fold symmetry is observed at a full width at half maximum is about 20 degrees. It was confirmed that the crystallographic orientation above is established in-plane aligned in the tape. A critical current density of approximately $1.5 \times 10^5$ A/cm$^2$ is obtained at 77 K. Both specimens of the superconductive wire yielded a tensile strength of about 30 kg/mm$^2$. They exhibited spring properties, and no degradation of superconductivity occurred by deformation.

As a comparative material, a sheet of silver alone is subjected to repeated rolling at room temperature to obtain a tape-like specimen about 0.1 mm in sheet thickness. The tensile strength of the resulting specimen is about 25 kg/mm$^2$. An $YBa_2Cu_3O_{7-\delta}$ film is formed similarly by means of laser ablation at 650° C. on the resulting metallic tape at a thickness of about 500 nm to perform the experiments. The silver specimen showed an orientation along (110) plane, and the $Yba_2Cu_3O_{7-\delta}$ film is found to have a favorable c-axis orientation upon measuring the crystallographic orientation by means of X-ray diffraction. On obtaining the pole figure of the film, four-fold symmetry is observed and the full width at half maximum is about 20 degrees. It was confirmed that the crystallographic orientation above is established in plane of the tape. Furthermore, a critical current density of approximately $2 \times 10^5$ A/cm$^2$ is obtained at 77 K. However, the superconductive wire yielded an extremely low tensile strength of approximately 3 kg/mm$^2$, and it easily underwent plastic deformation to show degradation in superconductivity by deformation.

EXAMPLE 2

A second embodiment according to the present invention is described below. The constitution of the present embodiment is similar to that shown in FIG. 1.

Referring to FIG. 1, an silver based alloy containing about 99.9 atomic % of Ag and about 0.1 atomic % of Cu is produced as the first metal 12 by a common melting method, and is processed into a tube about 4 mm in inner diameter and about 6 mm in outer diameter. Six nickel based alloys containing about 10 atomic % Cu, about 3 atomic % Al, about 5 atomic % Mn, about 2 atomic % Si, or about 3 atomic % Sb, about 10 atomic % Zn, are produced similarly and is processed into a rod about 4 mm in outer diameter. The resulting rod is inserted into resulting tube, and the both ends of the resulting tube are vacuum-sealed to obtain an airtight structure. Then, in a manner similar to that described in Example 1, a metallic tape 14 about 0.05 mm in thickness is prepared and a $YBa_2Cu_3O_{7-\delta}$ film 13 is formed thereon.

On measuring the tensile strength, the metallic tape 14 thus obtained by the process above is found to yield a tensile strength improved by alloying, which achieved a high value of about 60 to 70 kg/mm$^2$. The silver alloy is investigated by means of X-ray diffraction to find a (110) crystallographic orientation. The specimen obtained by forming an oxide superconductor film 13 on the metallic tape 14 showed no peeling off of the silver alloy layer, and is found to have a favorable c-axis crystallographic orientation. On obtaining the pole figure, four-fold symmetry is observed. A critical current density of approximately 1 to 2×10$^5$ A/cm$^2$ is obtained at 77 K. The sample yielded a tensile strength in a range of about 40 to 50 kg/mm$^2$, and exhibited spring properties. Similarly, no degradation of superconductivity occurred by deformation. The cross section of the superconductive wire was analyzed to find that the elements added into nickel diffused into silver, and it was confirmed that a strong joint is metallurgically established.

EXAMPLE 3

A third embodiment according to the present invention is described below. The constitution of the present embodiment is similar to that shown in FIG. 1.

Referring to FIG. 1, silver based alloys each containing about 99 atomic % Ag and about 1 atomic % Sb, about 99 atomic % Ag and about 1 atomic % Sn, about 99 atomic % Ag and about 1 atomic % Ge, about 99 atomic % Ag and about 1 atomic % Ga, about 99 atomic % Ag and about 1 atomic % In, about 99 atomic % Ag and about 1 atomic % Zn, about 99 atomic % Ag and about 1 atomic % Pt, and about 99 atomic % Ag and about 1 atomic % Pd are produced as the first metal 12 by a common melting method, and then are each processed into a sheet about 2 mm in thickness. Iron is used as the second metal 11, and an iron sheet about 5 mm in thickness is prepared. Then, the periphery of the second metal 11 is covered with the first metal 12, and the resulting first metal 12 is subjected to rolling to expose the (110) plane on the surface of the first metal 12. Then, in a manner similar to that described in Example 1, metallic tapes 14 each about 0.05 mm in thickness are prepared and an YBa$_2$Cu$_3$O$_{7-\delta}$ film is formed thereon.

On measuring the tensile strength, the metallic tapes 14 thus obtained by the process above are found to yield a high value in a range of about 50 to 60 kg/mm$_2$. The silver alloy of each of the tapes was investigated by means of X-ray diffraction to find a (110) crystallographic orientation. The specimens obtained by forming an oxide superconductor film 13 on each of the metallic tapes 14 showed no peeling off of the silver alloy layer, and are found to have a favorable c-axis crystallographic orientation. On obtaining the pole figure, four-fold symmetry is observed. A critical current density of approximately 1 to 2×10$^5$ A/cm$^2$ at 77 K is obtained on each of the metallic tapes 14. The superconductive wires obtained from each of the metallic tapes above yielded a tensile strength in a range of about 30 to 50 kg/mm$^2$, and exhibited spring properties. Similarly, no degradation of superconductivity occurred by deformation.

As a comparative sample, a metallic tape similar to those of Example 3 is prepared by using a silver tube and an iron rod, and an oxide superconductor film is formed thereon. However, a superconductive wire is found unfeasible in this case because peeling off proceeded locally on the silver layer.

EXAMPLE 4

A fourth embodiment according to the present invention is described below. The constitution of the present embodiment is similar to that shown in FIG. 1.

A sintered alloy is employed in the present example. A sintered alloy is an alloy obtained by powder metallurgy; i.e., an alloy prepared by mixing a plurality of powders of metals, which are difficult to form a solid solution with each other, and sintering the resulting powder mixture. Thus, a sintered alloy consists of elements that are not mixed in the atomic level. In the case of preparing a sintered alloy by using a silver powder and a nickel powder as in the present Example, nickel grains about 1 μm in size precipitate in silver.

Referring to FIG. 1, a second metal 11 is prepared in the form of a cylindrical rod about 4 mm in outer diameter by processing a sintered alloy prepared from a mixed material comprising about 90 atomic % silver powder and about 10 atomic % of a nickel powder. The cylindrical rod is sealed inside a silver tube employed as the first metal 12, and the resulting product is wire drawn and rolled to obtain a metallic tape 14 about 0.1 mm in thickness. An YBa$_2$Cu$_3$O$_{7-\delta}$ film is then formed thereon by a method similar to that described in Example 1.

The metallic tape 14 thus obtained by the process above is found to yield a tensile strength of about 20 kg/mm$^2$. The silver layer of the tape was investigated by means of X-ray diffraction to find a (110) crystallographic orientation. The metallic tape 14 thus obtained is annealed by holding it at about 700° C. for duration of 1 hour to obtain a plane having a (210) crystallographic orientation on the surface. The tensile strength at this instance is about 10 kg/mm$^2$. The sample thus obtained is free from any peeling off of the silver layer, and exhibited a favorable c-axis crystallographic orientation. On obtaining the pole figure, four-fold symmetry is observed. A critical current density of approximately 2×10$^5$ A/cm$^2$ at 77 K is obtained. It exhibited spring properties, and no degradation of superconductivity occurred by deformation.

EXAMPLE 5

Figure 2:
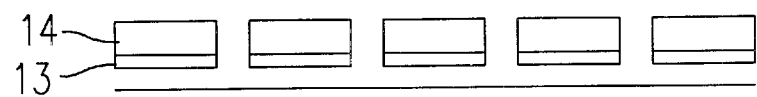
FIG. 2 shows a cross-sectional view showing a basic constitution of the superconductive device using an oxide superconductive wire according to an embodiment of the present invention.
Figure 2:
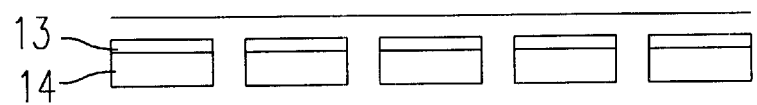

A fifth embodiment according to the present invention is described below. In the present Example, the surface of the superconductive wire obtained in Example 1 is insulated by coating it with an organic insulator, and the resulting wire is coiled into a cylindrical shape about 50 mm in diameter. FIG. 2 shows the cross section of the coil according to the present Example. As shown in FIG. 2, the coil is so fabricated that the plane having the oxide superconductive film 13 formed thereon might be located on the inner side of the coil.

On measuring the critical current density of the coil thus obtained, a value of approximately 1.5×10$^5$ A/cm$^2$, i.e., substantially the same value as that of the raw material, is obtained. Furthermore, although the coil is repeatedly subjected to cooling and heating between room temperature and the liquid nitrogen temperature, no change in properties is observed.

To obtain a comparative coil, a superconductive wire is fabricated and coated, and is coiled in such a manner that the plane having thereon the oxide superconductor film might be on the outer side. On measuring the critical current density of the coil thus obtained, it is found that the oxide superconductor film is pulled downward because the plane having thereon the oxide superconductor is placed on the outside of the coil, and the value is lowered to approximately 1×10$^4$ A/cm$^2$, i.e., an order of magnitude lower than the value obtained for the wire material. Moreover, the critical current density of the coil is further lowered by repeatedly subjecting the coil to cooling and heating between room temperature and the liquid nitrogen temperature.

In the present invention, there can also be used a perovskite-type oxide superconductor containing a rare-earth element, a Bi—Sr—Ca—Cu—O system oxide superconductor, or a Tl—Ba—Ca—Cu—O system oxide superconductor as the oxide superconductor. As the perovskite-type oxide superconductor containing a rare-earth element, there can be mentioned oxides represented by $REM_2Cu_3O_{7-\delta}$ (wherein RE represents at least one element selected from Y, La, Nd, Sm, Eu, Gd, Dy, Ho, Er, Tm, and Yb; and M represents at least one element selected from Ba, Sr, and Ca). The Bi—Sr—Ca—Cu—O based oxide superconductors include those represented by $Bi_2Sr_2Ca_2Cu_3O_x$, $Bi_2(Sr, Ca)_3Cu_2O_x$, (wherein Bi may be partially replaced by Pb), etc., and the Tl—Ba—Ca—Cu—O system oxide superconductors refer to those represented by $Tl_2Ba_2Ca_2Cu_3O_x$, $Tl_2(Ba, Ca)_3Cu_2O_x$.

In the metallic tape for use in the present invention, silver is necessary to form a favorable film of the oxide superconductor by suppressing the reaction between the oxide superconductor and the alloy during the deposition of the oxide superconductive film. Furthermore, it is preferred to use a silver alloy containing a small amount of copper as an additional element to prevent diffusion of copper into silver from occurring, because copper is lost from the alloy during the formation of the oxide superconductor.

In case of an application under alternating current (AC), it is preferred to use a silver alloy containing at least one element selected from copper, antimony, tin, germanium, gallium, indium, zinc, platinum, and palladium as the first metal. The additional alloy elements increase the electric resistivity of the silver alloy, work effectively for reducing alternating current loss, and yet, have little influence on impairing the superconductive properties. The amount of addition for the additive elements is preferably 5% by atomic or less.

The crystallographic orientation of silver or the silver alloy is preferably controlled to yield a predetermined orientation, and particularly preferred is a collective texture arranged to yield (110), (100), and (210) orientations. By using the crystallographic planes arranged to those particular orientations, an increase in critical current density ascribed to the crystallographic orientation of the oxide conductor film can be expected.

Preferably, the surface of the rolls for use in the rolling process in the fabrication of the metallic tape is specular finished as possible. By providing mirror-finished planes to the roll, an oxide superconductive film having a higher critical current density can be obtained.

To obtain a metal having a higher tensile strength than that of silver, it is preferred to use at least one selected from the group consisting of nickel, iron, chromium, and alloys thereof. Because the metals above are less apt to form alloys with silver, silver does not react with these metals and retains its function even in case the alloy tape is heated on forming the film of an oxide superconductor; moreover, these metals effectively increases the tensile strength. Particularly in case of using nickel, the joint strength thereof with silver can be improved by adding at least one metal selected from the group consisting of aluminum, copper, chromium, manganese, silicon, antimony, and zinc. Furthermore, the addition of such substances is effective, because it decreases the ferromagnetism as to reduce the AC loss caused thereby.

It is also possible to use a powder-sintered alloy as a metal having a tensile strength higher than that of silver. Such a powder alloy is available by preparing a powder of a metal having a higher tensile strength than that of silver, mixing the powder with a silver powder, pressing and sintering the mixed powder, and processing the resulting sintering into a rod or a sheet. In case a powder alloy is used, higher adhesion strength can be realized with the metallic tape and the silver or silver alloy covering the outside, because silver contained in the powder alloy exhibits good affinity with the outer silver.

As described above, the superconductive wire prepared in the present invention establishes a favorable electric connection with the metallic tape. Thus, it exhibits excellent stability against quenching and the like. Furthermore, to manufacture practical superconductive appliances with stable properties, the surface of the oxide superconductive wire is covered with a metal or an organic material to reduce the change due to aging, and the oxide superconductive wire is coiled in such a manner that the surface having formed thereon the oxide superconductive film is provided at the inner side of the coil.

Although a laser ablation method is described above in detail as an example of fabricating the superconductive film, there can also be used other methods such as vapor phase growth methods inclusive of sputtering, vacuum evaporation, CVD, etc., or liquid phase growth methods such as liquid phase epitaxy, oriented solidification, etc., or solid phase film formation methods such as doctor blade method, MOD, etc. The film is generally formed at a temperature of 600° C. or higher, but if necessary, a thermal treatment in a lower temperature range of from 400 to 500° C. may be applied to effectively increase the critical current density.

As described in detail above, the superconductive wire according to the present invention exhibits high adhesion strength between the core material and silver. Hence, the present invention provides an oxide superconductive wire having practically sufficient tensile strength and superconductive properties.

Furthermore, the superconductive wire according to the present invention is of high productivity because it allows direct formation of an oxide superconductor on a metallic substrate. Moreover, it provides a higher effective critical current density because of it can be fabricated thinner. By placing the superconductive on the inside of the coil in case of coiling the wire and by using the resulting coil, it also enables a superconductive device free from degradation in properties and unfavorable aging.

Each of the composition or the elements of the materials of the layers of the wire or the device may changed after application of thermal energy by virtue of diffusion or/and element mixture between the adjacent layers and the wire or the device having changed composition or the elements of the materials may be in the scope of the present invention unless the characteristic of the materials of the layer changes.

While the invention has been described in detail by making reference to specific embodiments, it should be understood that various changes and modifications may be made without departing from the scope and the spirit of the present invention.

What is claimed is:

1. An oxide superconductive wire, comprising:
   a first metallic layer including a first surface and a second surface opposing the first surface, the first metallic layer being made of silver based alloy, the silver based alloy consisting essentially of silver and a metal selected from the group consisting of copper, antimony, tin, germanium, gallium, indium, and zinc;

a second metallic layer fixed on the first surface of the first metallic layer and having a tensile strength higher than that of silver; and an oxide superconductor layer in direct contact with the second surface of the first metallic layer.

2. The oxide superconductive wire of claim 1, wherein the second metallic layer consists essentially of nickel, iron, or chromium.

3. The oxide superconductive wire of claim 1, wherein the first metallic layer covers the second metallic layer.

4. The oxide superconductive wire of claim 1, wherein the first metallic layer is oriented along the crystallographic (110) plane, (100) plane, or (210) plane.

5. The oxide superconductive wire of claim 1, wherein the silver based alloy consists essentially of silver and copper.

6. The oxide superconductive wire of claim 1, wherein the silver based alloy consists essentially of silver and a metal selected from the group consisting of antimony, tin, germanium, gallium, indium, and zinc.

7. A method of making a superconductive wire, the method comprising depositing an oxide superconductor layer on a first metallic layer, where the first metallic layer is on a second metallic layer; and producing the oxide superconductive wire of claim 1.

8. An oxide superconductive wire, comprising:

a first metallic layer made of silver based alloy, the silver based alloy consisting essentially of silver and a metal selected from the group consisting of copper, antimony, tin, germanium, gallium, indium, zinc, platinum and palladium;

a second metallic layer fixed on the first metallic layer and having a tensile strength higher than that of silver; and an oxide superconductor layer formed on the first metallic layer, wherein the second metallic layer is made of nickel based alloy, and the nickel based alloy consists essentially of nickel and an element selected from the group consisting of aluminum, copper, chromium, manganese, silicon, antimony, and zinc.

9. A method of making a superconductive wire, the method comprising depositing an oxide superconductor layer on a first metallic layer, where the first metallic layer is on a second metallic layer; and producing the oxide superconductive wire of claim 8.

10. An oxide superconductive wire, comprising:

a first metallic layer made of silver based alloy, the silver based alloy consisting essentially of silver and a metal selected from the group consisting of copper, antimony, tin, germanium, gallium, indium, zinc, platinum and palladium;

a second metallic layer fixed on the first metallic layer and having a tensile strength higher than that of silver; and an oxide superconductor layer formed on the first metallic layer, wherein the second metallic layer is made of sintered silver based alloy.

11. A method of making a superconductive wire, the method comprising depositing an oxide superconductor layer on a first metallic layer, where the first metallic layer is on a second metallic layer; and producing the oxide superconductive wire of claim 10.

12. An oxide superconductive wire, comprising:

a first metallic layer including a first surface and a second surface opposing the first surface, the first metallic layer being made of silver or silver based alloy, the silver based alloy consisting essentially of silver and a metal selected from the group consisting of copper, antimony, tin, germanium, gallium, indium, zinc, platinum and palladium;

a second metallic layer made of sintered alloy, having a tensile strength higher than that of silver, and fixed on the first surface of the first metallic layer, the sintered alloy consisting essentially of silver powder and powder of nickel, iron, chromium, or a nickel based alloy, the nickel based alloy consisting essentially of nickel and an element selected from the group consisting of aluminum, copper, chromium, manganese, silicon, antimony, and zinc; and an oxide superconductor layer formed on the second surface of the first metallic layer.

13. The oxide superconductive wire of claim 12, wherein the first metallic layer is oriented along the crystallographic (110), (100), or (210) plane.

14. The oxide superconductive wire of claim 12, wherein the first metallic layer covers the second metallic layer.

15. The oxide superconductive wire of claim 12, wherein the silver based alloy consists essentially of silver and a metal selected from the group consisting of copper, antimony, tin, germanium, gallium, indium, and zinc.

16. A method of making a superconductive wire, the method comprising depositing an oxide superconductor layer on a first metallic layer, where the first metallic layer is on a second metallic layer; and producing the oxide superconductive wire of claim 12.

* * * * *

UNITED STATES PATENT AND TRADEMARK OFFICE
CERTIFICATE OF CORRECTION

PATENT NO. : 6,349,226 B1
DATED : February 19, 2002
INVENTOR(S) : Yoshino et al.

It is certified that error appears in the above-identified patent and that said Letters Patent is hereby corrected as shown below:

<u>Title page,</u>
Item [73], the Assignee's information should read:
-- [73]   Assignee:    Kabushiki Kaisha Toshiba, Kawasaki (JP) --

Signed and Sealed this

Seventeenth Day of September, 2002

Attest:

JAMES E. ROGAN
*Attesting Officer*    *Director of the United States Patent and Trademark Office*